us008477125B2

United States Patent
Park et al.

(10) Patent No.: US 8,477,125 B2
(45) Date of Patent: Jul. 2, 2013

(54) PHOTO SENSOR AND ORGANIC LIGHT-EMITTING DISPLAY USING THE SAME

(75) Inventors: Hye Hyang Park, Suwon-si (KR); Byoung Deog Choi, Suwon-si (KR); Sun A Yang, Suwon-si (KR); Youn Chul Oh, Suwon-si (KR); Eun Jung Lee, Suwon-si (KR); Won Seok Kang, Suwon-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 1419 days.

(21) Appl. No.: 11/641,842

(22) Filed: Dec. 20, 2006

(65) Prior Publication Data

US 2007/0138951 A1 Jun. 21, 2007

(30) Foreign Application Priority Data

Dec. 21, 2005 (KR) .................. 10-2005-0127228
Nov. 7, 2006 (KR) .................. 10-2006-0109487

(51) Int. Cl.
*G09G 5/00* (2006.01)
(52) U.S. Cl.
USPC ............ 345/207; 345/204; 345/211; 345/76; 345/82; 345/77; 257/656; 257/184; 257/292; 257/293; 250/206; 315/169.3; 313/503; 313/504
(58) Field of Classification Search
USPC .................. 257/E27.133, 461–463, 656, 184, 257/292, 293; 345/173–175, 204, 211, 76, 345/82, 77, 207; 250/206; 315/169.3; 313/503, 313/504; 438/22–28
See application file for complete search history.

(56) References Cited

U.S. PATENT DOCUMENTS

| 3,812,518 | A | * | 5/1974 | Kurz et al. .................. 257/465 |
| 4,841,349 | A | * | 6/1989 | Nakano ......................... 257/75 |
| 6,111,305 | A | * | 8/2000 | Yoshida et al. ............... 257/656 |
| 6,995,753 | B2 | | 2/2006 | Yamazaki et al. |
| 7,068,246 | B2 | | 6/2006 | Yamazaki et al. |
| 7,288,753 | B2 | * | 10/2007 | Cok ........................ 250/214 R |
| 7,289,088 | B2 | | 10/2007 | Matsumoto |
| 2001/0052597 | A1 | | 12/2001 | Young et al. |
| 2002/0024058 | A1 | * | 2/2002 | Marshall et al. ............. 257/170 |
| 2002/0027229 | A1 | * | 3/2002 | Yamazaki et al. ............ 257/84 |
| 2002/0180672 | A1 | | 12/2002 | Yamazaki et al. |
| 2004/0041756 | A1 | * | 3/2004 | Henmi et al. .................. 345/76 |
| 2004/0263069 | A1 | | 12/2004 | Yamazaki et al. |
| 2005/0035932 | A1 | | 2/2005 | Nishikawa et al. |
| 2005/0083323 | A1 | * | 4/2005 | Suzuki et al. ................ 345/207 |
| 2005/0093466 | A1 | | 5/2005 | Matsumoto |
| 2005/0200310 | A1 | * | 9/2005 | Brown ......................... 315/291 |
| 2005/0225683 | A1 | * | 10/2005 | Nozawa ....................... 348/801 |
| 2005/0237317 | A1 | * | 10/2005 | Cok .............................. 345/207 |
| 2005/0248264 | A1 | | 11/2005 | Cok |
| 2006/0030084 | A1 | | 2/2006 | Young |

FOREIGN PATENT DOCUMENTS

| CN | 1 678 952 A | 10/2005 |
| EP | 1 463 117 | 9/2004 |
| JP | 04-196179 A | 7/1992 |
| JP | 04-296054 A | 10/1992 |

(Continued)

*Primary Examiner* — Lun-Yi Lao
*Assistant Examiner* — Gregory J Tryder
(74) *Attorney, Agent, or Firm* — Lee & Morse, P.C.

(57) ABSTRACT

An organic light-emitting display includes a substrate, a thin film transistor on the substrate, an organic light-emitting diode electrically connected to the thin film transistor, and a photo sensor having a plurality of photo diodes connected to one another in parallel.

9 Claims, 4 Drawing Sheets

FOREIGN PATENT DOCUMENTS

| | | |
|---|---|---|
| JP | 2002-062856 A | 2/2002 |
| JP | 2005-107890 A | 4/2005 |
| KR | 10-2000-0010923 | 2/2000 |
| KR | 10-2001-0112630 A | 12/2001 |
| KR | 10-2004-0056461 | 7/2004 |
| WO | WO 2004/019123 | 3/2004 |
| WO | WO 2004/109641 | 12/2004 |
| WO | WO 2005/093838 | 10/2005 |

* cited by examiner

PHOTO SENSOR AND ORGANIC LIGHT-EMITTING DISPLAY USING THE SAME

BACKGROUND OF THE INVENTION

1. Field of the Invention

The present invention relates to organic light-emitting displays. In particular, the present invention relates to an organic light-emitting display having a photo sensor capable of providing improved luminance control thereof.

2. Description of the Related Art

In general, an organic light-emitting display is a flat display device where voltage may be applied to a plurality of layers interposed between two electrodes, i.e., an anode and a cathode, to combine electrons and holes to form images. More particularly, the conventional organic light-emitting display may include a hole injection layer, a hole transport layer, at least one organic light-emitting layer, an electron injection layer, and an electron transport layer. Accordingly, holes may be injected into the hole injection layer from the anode electrode and transported into the organic light-emitting layer through the hole transport layer. Similarly, electrons from the cathode may be injected into the electron injection layer and transported to the organic light-emitting layer through the electron transport layer. The transported holes and electrons may be combined with one another in the organic light-emitting layer to form excitons, and thereby, emit visible light.

The conventional organic light emitting layer of the organic light-emitting display may deteriorate over time and, thereby, reduce display luminance. In other words, once the organic light-emitting layer deteriorates, the brightness of light emitted from the organic light emitting layer may deviate from the required brightness value, thereby reducing the image quality of the organic light emitting display and its overall lifespan. Attempts have been made to improve the brightness of the organic light-emitting display device by incorporating a photo diode therein, such that a constant electric signal from the photo diode may trigger constant luminance from the organic light-emitting display, regardless of the deterioration state of the organic light-emitting layer. However, the conventional photo diode may have a limited electric signal output, thereby limiting the luminance control efficiency, i.e., reducing the luminance adjustment range.

Accordingly, there exists a need for an organic light-emitting display device with a photo diode capable of controlling luminance thereof by efficient electric signals.

SUMMARY OF THE INVENTION

The present invention is therefore directed to a photo sensor, an organic light-emitting display and an electronic apparatus using the same, which substantially overcome one or more of the disadvantages of the related art.

It is therefore a feature of the present invention to provide a photo sensor capable of controlling luminance of an organic light-emitting diode by providing electric signals thereto via a plurality of photo diodes.

It is another feature of the present invention to provide an organic light-emitting display having a photo sensor capable of providing an improved luminance control thereof.

It is yet another feature of the present invention to provide an electronic apparatus having an organic light-emitting display with a photo sensor capable of providing improved luminance control.

At least one of the above and other features and advantages of the present invention may be realized by providing a photo sensor including a plurality of photo diodes connected to one another in parallel. The plurality of photo diodes may be capable of absorbing external light and outputting a corresponding electric signal.

Each photo diode may be a PIN photo diode. Additionally, each PIN photo diode may include an intrinsic region between an N-type doping region and a P-type doping region. Alternatively, each photo diode may be a PN diode. Each PN photo diode may include an N-type doping region adjacent to a P-type doping region, wherein the N-type doping region and the P-type doping region may be on a same plane.

In another aspect of the present invention, there is provided an organic light-emitting display, including a substrate, a thin film transistor on the substrate, an organic light-emitting diode electrically connected to the thin film transistor, and a photo sensor having a plurality of photo diodes connected to one another in parallel.

The photo sensor may be positioned on the non-pixel region of the substrate. Additionally, the photo sensor may be capable of receiving light from the organic light-emitting diode and generate a corresponding electric signal. Further, the plurality of photo diodes may be capable of absorbing external light and outputting a corresponding electric signal.

Each photo diode may be a PIN photo diode. Additionally, each PIN photo diode may include an intrinsic region between an N-type doping region and a P-type doping region. Alternatively, each photo diode may be a PN diode. Each PN photo diode may include an N-type doping region adjacent to a P-type doping region.

In yet another aspect of the present invention, there is provided a portable electronic apparatus, including an organic light-emitting display device having a substrate, a thin film transistor, an organic light-emitting diode electrically connected to the thin film transistor, and a photo sensor having a plurality of photo diodes connected to one another in parallel.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
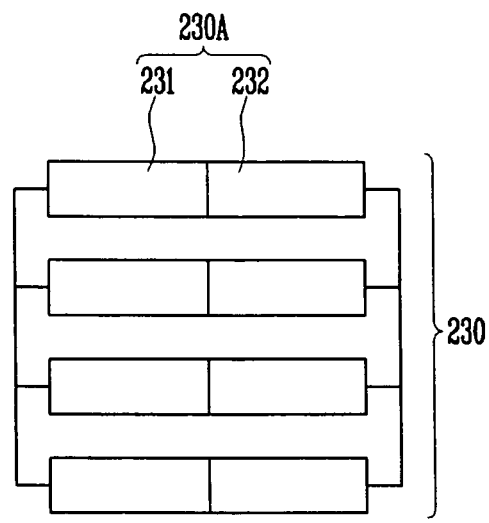
FIG. 1 illustrates a plan view of a photo sensor according to an exemplary embodiment of the present invention.

Korean Patent Application No. 10-2005-0127228, filed on Dec. 21, 2005 in the Korean Intellectual Property Office, and entitled: "Organic Light-emitting Display Device having a Photo Diode," and Korean Patent Application No. 10-2006-0109487, filed on Nov. 7, 2006 in the Korean Intellectual Property Office, and entitled: "Photo Diode and Organic Light-emitting Display Device having the Photo Diode," are incorporated by reference herein in their entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or an element is referred to as being "on" another layer, element or substrate, it can be directly on the other layer, element or substrate, or intervening layers or elements may also be present. Further, it will be understood that when a layer or an element is referred to as being "under" another layer or element, it can be directly under, or one or more intervening layers or elements may also be present. In addition, it will also be understood that when a layer or an element is referred to as being "between" two layers or elements, it can be the only layer or element between the two layers or elements, or one or more intervening layers or elements may also be present. Like reference numerals refer to like elements throughout.

Hereinafter, an exemplary embodiment of a photo sensor according to the present invention will be described in more detail below with reference to FIG. 1. As illustrated in FIG. 1, a photo sensor 230 according to an embodiment of the present invention may include a plurality of photo diodes 230A, i.e., at least two photo diodes 230A. Each photo diode 230A may have a first region 231 and a second region 232, such that the first and second regions 231 and 232 may be adjacent to one another.

In particular, each photo diode 230A may be formed of amorphous silicon and crystallized by a predetermined thermal treatment, i.e., any appropriate heat treatment of amorphous silicon material as determined by a person skilled in the art, to form a polycrystalline silicon. Next, a high concentration of N-type impurity ions may be implanted in the polycrystalline silicon of the first region 231 to form an N-type doping region 231, and a high concentration of P-type impurity ions may be implanted in the polycrystalline silicon of the second region 232 to form a P-type doping region 232. Accordingly, each photo diode 230A may be a PN-type photo diode, i.e., an N-type doping region 231 and a P-type doping region, while the N-type and P-type doping regions 231 and 232 may be positioned on a same plane, adjacent to one another.

In general, a current amount flowing through a photo diode may be proportional to an area of a photo diode when a current density is constant. In other words, and with respect to equation (1) below, the greater an area of a photo diode, the higher a current amount through it.

$$I_d = J \times A \quad (1)$$

where $I_d$ is an electric current, J is a current density, and A is an area of the photo diode. However, formation of a photo diode in an organic light emitting display may restrict the area thereof.

Accordingly, the plurality of photo diodes 230A of the photo sensor 230 may be connected to one another in parallel, such that a total area of the photo sensor 230 and the current therethrough may be increased, while the current value through each individual photo diode 230A may remain constant. Such a structure of photo diodes may facilitate current control through the photo sensor 230 and, thereby, enhance the control of electric signals, i.e., range of output current or voltage, generated by the photo sensor 230. In particular, when an anode voltage is applied to the P-type doping region 232 of the photo diodes 230A, and a cathode voltage is applied to the N-type doping region 231 of the photo diodes 230A, a junction therebetween may become fully depleted, such that charges may be produced in response to light incident through a surface of the depletion region. The plurality of photo diodes 230A may output an electrical signal with respect to the produced charges and proportionately to the density of the light.

Figure 2:
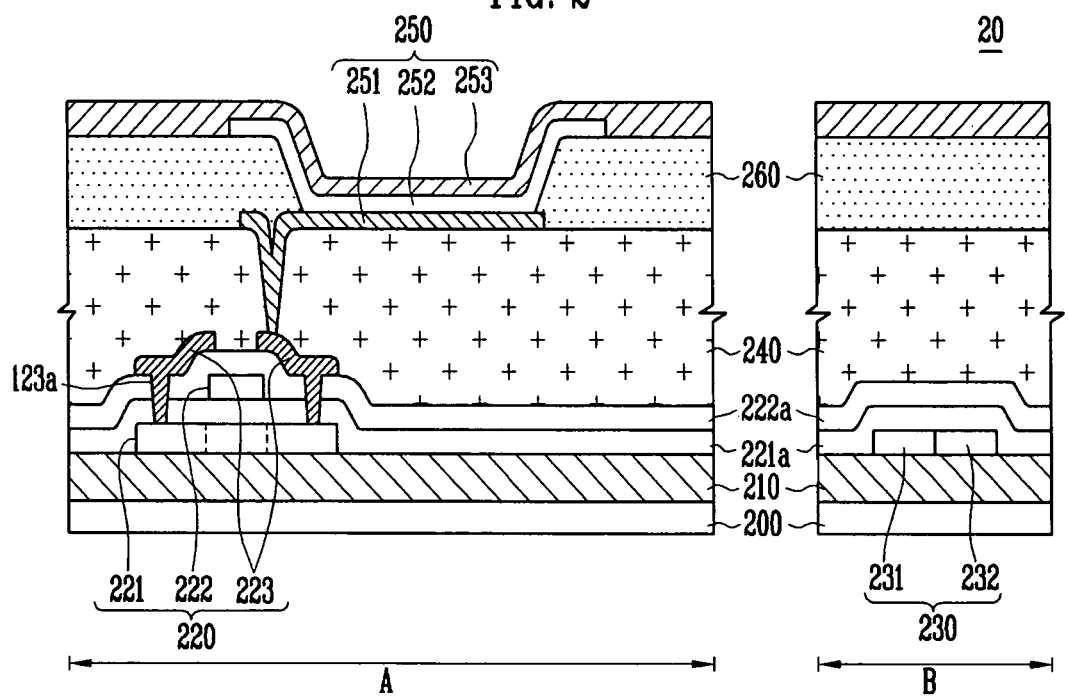
FIG. 2 illustrates a cross-sectional view of an organic light-emitting display having the photo sensor illustrated in FIG. 1.
Figure 3:
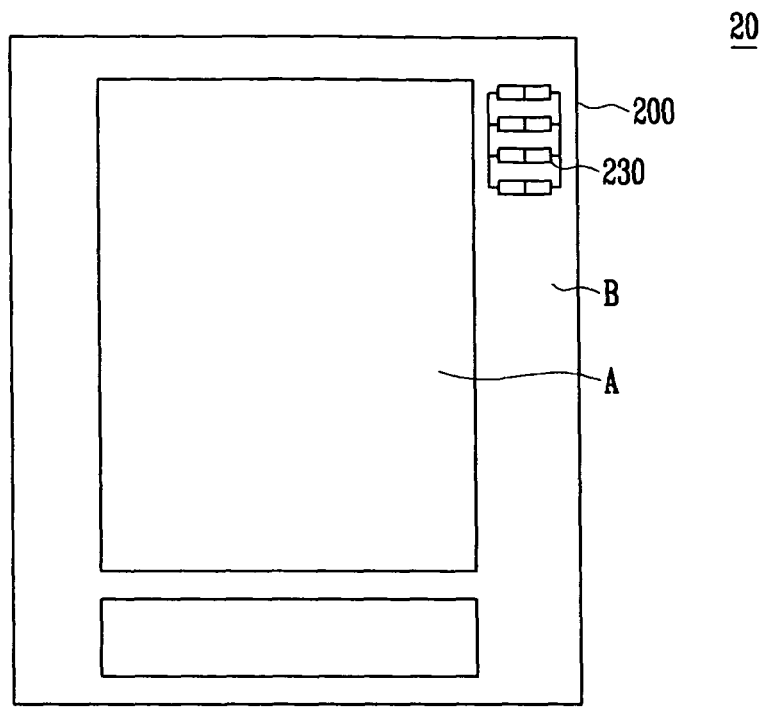
FIG. 3 illustrates a plan view of an organic light-emitting display having the photo sensor illustrated in FIG. 1.

An exemplary embodiment of the photo sensor 230 in an organic light-emitting display will be described in more detail with respect to FIGS. 2-3. As illustrated in FIGS. 2-3, an organic light-emitting display 20 may include a substrate 200, a thin film transistor 220, an organic light-emitting diode 250, and a photo sensor 230.

The substrate 200 may be made of any insulating material, e.g., glass, plastic, silicon, synthetic resin, and so forth, as determined by one of ordinary skill in the art. Preferably the substrate 200 may be transparent, e.g., a glass substrate. Additionally, the substrate 200 may be formed to have a pixel region A and a non-pixel region B therein, as illustrated in FIGS. 2-3, such that the pixel region A may include a central region of the substrate 200 that is capable of displaying images, e.g., an area including the organic light emitting diode 250, and the non-pixel region B may include a peripheral region of the substrate 200 surrounding the pixel region A that is not capable of displaying images, i.e., regions other than the pixel region A.

The thin film transistor 220 of the organic light-emitting display 20 may be formed in the pixel region A of the substrate 200 by crystallizing an amorphous silicon layer into a low temperature polysilicon (LTPS) via, for example, laser irradiation. The thin film transistor 220 may include a semiconductor layer 221, a gate electrode 222 with a predetermined pattern, and source/drain electrodes 223, wherein a gate insulating layer 221a may be disposed between the semiconductor layer 221 and the gate electrode 222 on the semiconductor layer 221 and an inter-dielectric layer 221a may be disposed between the gate electrode 222 and the source/drain electrode 223. The gate insulating layer 221a may be deposited on the substrate 200 and over the semiconductor layer 221 and the photo diode 220, as illustrated in FIG. 2, such that a portion of the gate insulating layer 221a may be positioned on the substrate 200 between the semiconductor layer 221 of the thin film transistor 220 and the photo sensor 230 to separate therebetween. The source/drain electrodes 223 may be disposed over the inter-dielectric layer 221a and electrically connected with both sides of the semiconductor layer 221 via a contact hole 123a formed through the gate insulating layer 221a and the inter-dielectric layer 222a.

The organic light-emitting diode 250 of the light-emitting display device 20 may be formed on the substrate 200 and include a first electrode layer 251, a second electrode layer 253, and a light emitting layer 252 therebetween. The organic light-emitting diode 250 may be electrically connected to the thin film transistor 220, i.e., any one of the source and drain electrodes 223, via a hole.

The first electrode layer 251 of the organic light-emitting diode 250 may be made of any suitable transparent conductor, e.g., indium-tin-oxide (ITO), indium-zinc-oxide (IZO), zinc oxide (ZnO), and so forth. The second electrode layer 253 of the organic light-emitting diode 250 may be formed on the first electrode layer 251. The light emitting layer 252 of the organic light-emitting diode 250 may be formed between the first and second electrode layers 251 and 253, respectively. In particular, the light emitting layer 252 may be formed to partially expose the first electrode layer 251. Further, the light emitting layer 252 may include a hole injecting layer, a hole transport layer, an electron transport layer and an electron injecting layer. Accordingly, the light emitting layer 252 may generate light when holes and electron injected from the first and second electrode layers 251 and 253, respectively, are coupled therein.

The photo sensor 230 of the light-emitting display device 20 may be any suitable optical sensor capable of receiving a light signal and converting the light signal into an electrical signal, e.g., current or voltage. For example, the photo sensor may be a semiconductor device having an optical detecting function, e.g., a plurality of photo diodes with a light detecting function at a junction thereof. In other words, because electrons or holes may be generated by means of absorption of photons, and, therefore, a conductivity of a plurality of photo diodes may be modulated with respect to a light signal detected therein, a plurality of photo diodes functioning as a photo sensor may convert light signals into electrical signals with respect to changes of current flow therein as related to optical changes.

Accordingly, the photo sensor 230 may be identical to the photo sensor 230 previously described with respect to FIG. 1, and therefore, its detailed structure and operation with respect to the N-type doping region 231 and P-type doping region 232 will not be repeated herein. The photo sensor 230 may include a plurality of photo diodes 230A formed of amorphous silicon in the non-pixel region B of the substrate 200, as illustrated in FIGS. 2-3, and crystallized as polycrystalline silicon through a predetermined heat treatment, i.e., any appropriate heat treatment of amorphous silicon material as determined by a person skilled in the art.

In particular, formation of the plurality of photo diodes 230A may be restricted in the non-pixel region B in terms of space. Therefore, according to an exemplary embodiment of the present invention, the plurality of photo diodes 230A may be connected to one another in parallel, as illustrated in FIG. 3, thereby providing a constant current value through each photo diode 230A, while having increased photo sensor 230 area and current flow. For example, a plurality of photo diodes 230A connected in parallel to one another and having a total area of W×L may include n individual photo diodes 230A, while each individual photo diode 230A may have an area of W/n×L.

The photo sensor 230 may absorb light emitted from the organic light-emitting diode 250 and convert it into electrical signals. In particular, light absorbed by the photo sensor 230, i.e., actual luminance values of the organic light-emitting diode 250, may be compared to a predetermined luminance reference value. Any deviation of the actual luminance values from the predetermined luminance reference value may be controlled by the photo sensor 230 via electrical signals, thereby facilitating constant luminance output from the organic light-emitting diode 250, i.e., light generated by the light emitting layer 252.

For example, electric signals generated by the photo sensor 230 may be inputted into a comparator for comparing actual luminance values with the predetermined luminance reference value. More specifically, when the electric signal outputted from the photo sensor 230, i.e., signals representing actual luminance values, is lower than the predetermined luminance reference value, the comparator may generate a control signal to increase the luminance of light emitted by the light-emitting layer 252 of the organic light-emitting diode 250. Similarly, when the electric signal outputted from the photo sensor 230 is higher than the predetermined luminance reference value, the comparator may generate a control signal to reduce the luminance of light emitted by the light-emitting layer 252 of the organic light-emitting diode 250. Alternatively, electric signals, i.e., electric current or a voltage, generated by the photo sensor 230 with respect to an amount of light absorbed from the organic light-emitting diode 250 may be supplied to a controller, so that the controller may output a respective control signal for controlling the luminance of the light-emitting layer 252 with respect to the light emitted therefrom. Accordingly, the photo sensor 230 may maintain constant luminance of light generated in the light-emitting layer 252 of the organic light-emitting diode 250.

The light-emitting display device 20 according to an embodiment of the present invention may also include a planarization layer 240. The planarization layer 240 may be formed on the thin film transistor 220 by depositing a layer of an oxide, e.g., silicon oxide ($SiO_2$) or a nitride, e.g., silicon nitride (SiNx). In particular, the planarization layer 240 may be positioned between the thin film transistor 220 and the organic light emitting diode 250, and a portion of the planarization layer 240 may be etched to expose one of the source and drain electrodes 223 in order to provide a connection between the thin film transistor 220 and the first electrode 251 of the organic light-emitting diode 250.

The light-emitting display device 20 according to an embodiment of the present invention may also include a pixel defining layer 260. The pixel defining film 260 may be formed on the planarization layer 240, such that the pixel defining film 260 may include an opening portion (not shown) to at least partially expose the first electrode layer 251 of the organic light emitting diode 250. In particular, the pixel defining layer 250 may be positioned between the first and second electrode layers 251 and 253 of the organic light emitting diode 250. The pixel defining film 260 may be made of an organic insulation material, e.g., acrylic organic compounds, polyamides, polyimides, and so forth.

The light-emitting display device 20 according to an embodiment of the present invention may also include a buffer layer 210 on the substrate 200. The buffer layer 210 may be formed of a single layer of silicon oxide ($SiO_2$) or silicon nitride ($SiN_x$), or the buffer layer 210 may have a multi-layer structure. The buffer layer 210 may minimize diffusion of impurities into the thin film transistor 220 and the photo diode 230 during post-processing thereof.

Figure 4:
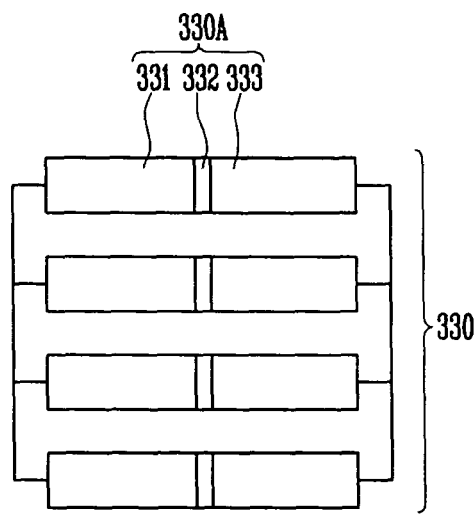
FIG. 4 illustrates a plan view of a photo sensor according to another exemplary embodiment of the present invention.

In another exemplary embodiment of the present invention, illustrated in FIG. 4, a photo sensor 330 according to the present invention may include a plurality of photo diodes 330A connected to one another in parallel and having a first region 331, a second region 333, and an intrinsic region 332, such that the first region 331, the second region 333, and the intrinsic region 332 may be formed on one plane and positioned adjacent to one another, i.e., PIN-type photo diode. In particular, the intrinsic region 332 may be positioned between the first and second regions 331 and 333. The photo sensor 330 may be formed in a similar manner to the photo sensor 230 described previously with respect to FIG. 1, and therefore, the detailed description of forming N-type and P-type impurity regions therein, i.e., doping regions corresponding to the first and second regions 331 and 333, will not be repeated.

The intrinsic region 332 of each photo diode 330A of the photo sensor 330 may be formed of polycrystalline silicon between the N-type doping region 331 and the P-type doping region 333, such that no impurities may be injected therein. Accordingly, when an anode voltage is applied to the P-type doping region 333 and a cathode voltage is applied to the N-type doping region 331 of each photo diode 330A, each respective intrinsic region 332 may become fully depleted and, thereby, absorb internal or external light. The intrinsic region 332 may generate charges with respect to the absorbed light through its surface, and, subsequently, convert the charges into electric signals. Without intending to be bound by theory, it is believed that the intrinsic region 332 may increase the thickness of a depletion layer of each photo diode 3330A, thereby decreasing a capacitance thereof. Such a decrease in capacitance of each photo diode 330A may increase the operation speed and decrease the power consumption thereof, as compared to the conventional photo sensor. Additionally, the photo sensor 330 may have a lower dark current, i.e., a current flow when a photo sensor is not exposed to light, as compared to the conventional photo sensor.

Figure 5:
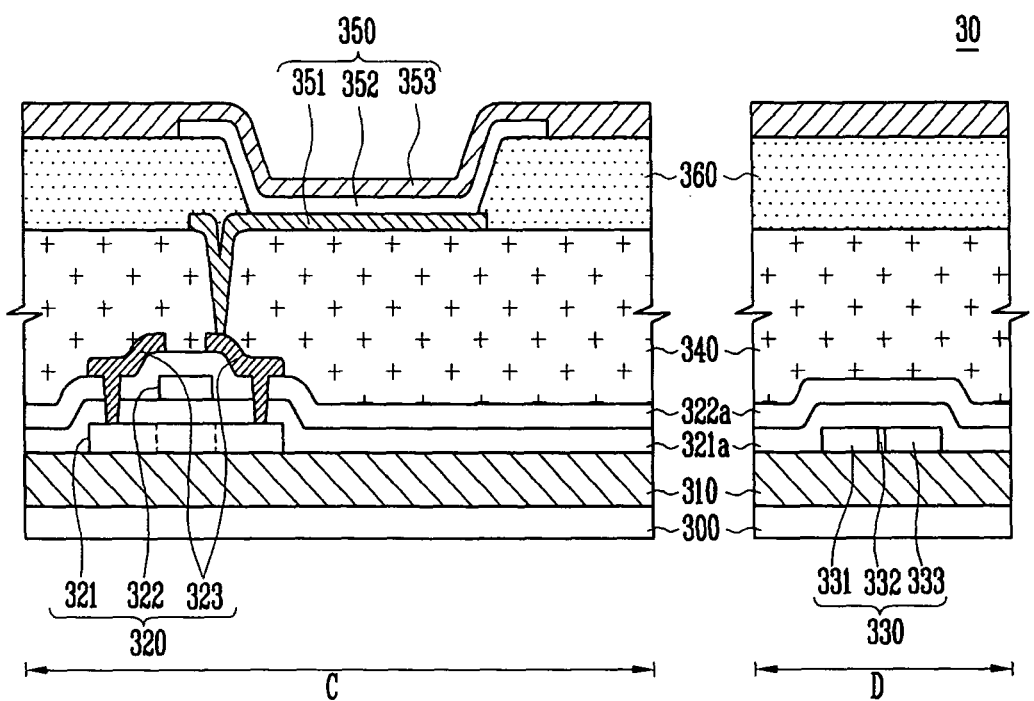
FIG. 5 illustrates a cross-sectional view of an organic light-emitting display having the photo sensor illustrated in FIG. 4.
Figure 6:
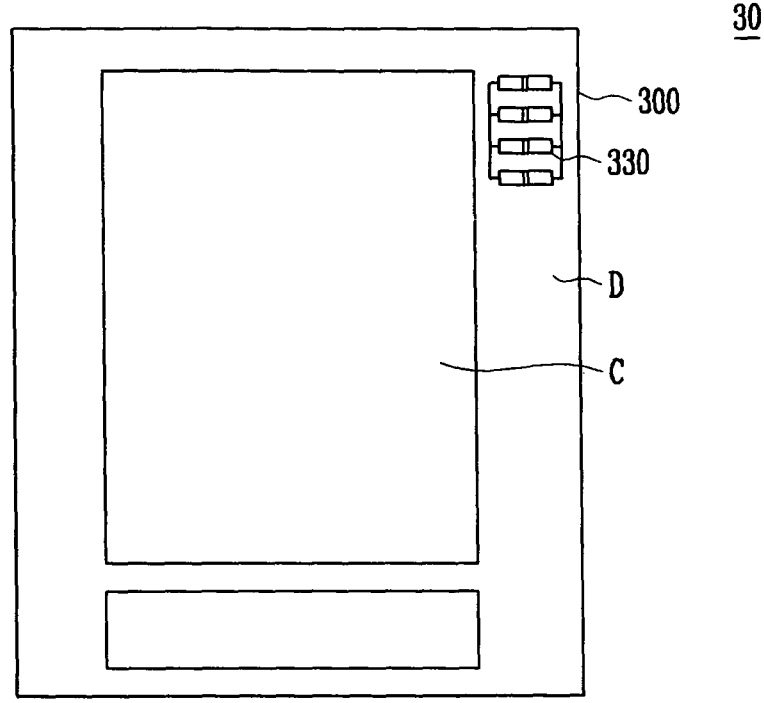
FIG. 6 illustrates a plan view of an organic light-emitting display having the photo sensor illustrated in FIG. 4.

An exemplary embodiment of the photo sensor 330 in an organic light-emitting display will be described in more detail with respect to FIGS. 5-6. As illustrated in FIGS. 5-6, an organic light-emitting display 30 may include a substrate 300 having a pixel region C and a non-pixel region D, a thin film transistor 320 on the pixel region C of the substrate 300, an organic light-emitting diode 350 electrically connected to the thin film transistor 320, and a photo sensor 330 having a plurality of photo diodes 330A at the non-pixel region D of the substrate 300. At least two of the photo diodes 330A may be connected to one another in parallel, as illustrated in FIG. 6.

The organic light-emitting display 300 may further include a buffer layer 310 deposited on the substrate 300, a planarization layer 340 deposited between the organic light emitting diode 350 and the thin film transistor 320, and a pixel defining film 360.

The structures of the substrate 300, the thin film transistor 320, the organic light-emitting diode 350, the buffer layer 310, the planarization layer 340, and the pixel defining film 360 may be similar to the respective structures of the substrate 200, the thin film transistor 220, the organic light-emitting diode 250, the buffer layer 210, the planarization layer 240, and the pixel defining film 260 described previously with respect to FIGS. 2-3 and, therefore, their detailed description will not be repeated hereinafter. Similarly, the structure of the photo sensor 330 may be identical to the structure of the photo sensor 330 previously described with respect to FIG. 4, and therefore, its detailed structure and operation will not be repeated herein.

The organic light-emitting display device according to the embodiments previously described with respect to FIGS. 1-6 may be employed in any portable apparatus, e.g., a portable phone, a digital camera, a television, a view finder type and a monitor direct view type video tape recorder, a car navigation device, a pager, an electronic note, an electronic calculator, a word processor, a workstation, a videophone, a POS terminal, and any device having a touch panel.

Figure 7:
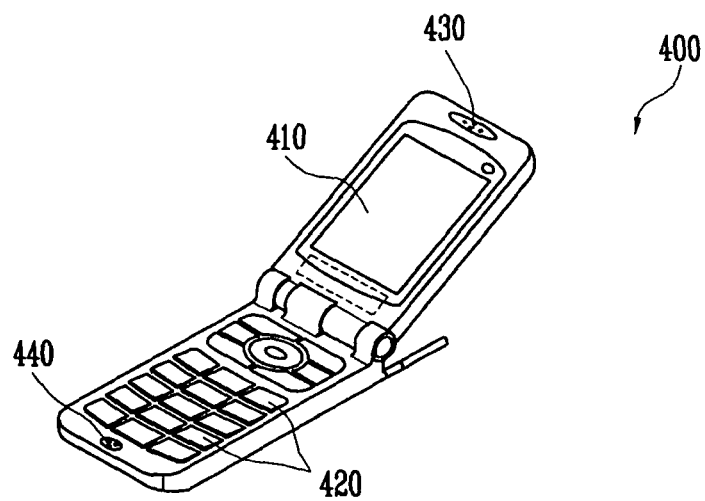
FIG. 7 illustrates a perspective view of an exemplary portable electronic device having an organic light-emitting display device according to an embodiment of the present invention.

In particular, as illustrated in FIG. 7, a portable phone 400 may include an organic light-emitting display panel 410 with the photo sensor (not shown) described previously with respect to FIGS. 1 and 4, a plurality of operation buttons 420, a receiving hole 430, and a transmitting hole 440.

The embodiment of the portable phone 400 according to the present invention illustrated in FIG. 7 is advantageous because the photo sensor employed in the display panel 410 minimizes the necessity of installing a special opening portion for a mounting space. Further, the photo sensor in the portable phone 400 can detect an accurate amount of internal/external light absorbed therein, such that a displayed image may have an enhanced luminance control in terms of its surrounding ambient light.

In accordance with the present invention, a structure of a photo sensor having a plurality of photo diodes connected to one another in parallel may be advantageous in improving luminance control of organic light emitting layers. In particular, current values through the photo sensor, i.e., plurality of photo diodes, may be increased to compensate for deteriorated material of an organic light-emitting layer and provide constant luminance. Moreover, an integration rate of the photo sensor may be improved to increase the availability of the total design.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A photo sensor in a non-pixel region of a display device, the photo sensor comprising:
   a plurality of PIN photo diodes connected to one another in parallel, each PIN photo diode including an intrinsic region between an N-type doping region and a P-type doping region, bottom surfaces of the intrinsic region and the N-type and P-type doping regions in each PIN photo diode being coplanar, wherein:
   the plurality of PIN photo diodes are configured to absorb light emitted from an organic light-emitting diode in a pixel region of the display device and to convert the absorbed light into a corresponding electrical signal that represents an actual luminance value of the organic light-emitting diode to compare the actual luminance value to a predetermined luminance value,
   the plurality of PIN photo diodes in the photo sensor are capable of maintaining a constant luminance of light generated in the organic light-emitting diode by converting the absorbed light into the corresponding electrical signal such that the actual luminance value is generated by the plurality of PIN photo diodes for comparing with the predetermined luminance value,
   when the electrical signal outputted from the photo sensor is lower than the predetermined luminance value, a luminance of light emitted by the organic light-emitting diode is increased, and
   when the electrical signal outputted from the photo sensor is higher than the predetermined luminance value, the luminance of light emitted by the organic light-emitting diode is reduced.

2. An organic light-emitting display, comprising:
   a substrate having a pixel region and a non-pixel region;
   a thin film transistor on the substrate in the pixel region of the substrate;
   an organic light-emitting diode electrically in the pixel region of the substrate and connected to the thin film transistor; and
   a photo sensor having a plurality of photo diodes connected to one another in parallel in the non-pixel region, at least one layer of the thin film transistor and the photo sensor being in a same plane, wherein:
   the plurality of photo diodes are configured to absorb light emitted from the organic light-emitting diode and to convert the absorbed light into a corresponding electrical signal that represents an actual luminance value of the organic light-emitting diode to compare the actual luminance value to a predetermined luminance value, the plurality of photo diodes in the photo sensor are capable of maintaining a constant luminance of light generated in the organic light-emitting diode by converting the absorbed light into the corresponding electrical signal such that the actual luminance value is generated by the plurality of photo diodes for comparing with the predetermined luminance value, when the electrical signal outputted from the photo sensor is lower than the predetermined luminance value, a luminance of light emitted by the organic light-emitting diode is increased, and when the electrical signal outputted from the photo sensor is higher than the predetermined luminance value, the luminance of light emitted by the organic light-emitting diode is reduced.

3. The organic light-emitting display as claimed in claim 2, wherein each photo diode is a PIN photo diode.

4. The organic light-emitting display as claimed in claim 3, wherein each PIN photo diode includes an intrinsic region between an N-type doping region and a P-type doping region.

5. The organic light-emitting display as claimed in claim 2, wherein each photo diode is a PN diode.

6. The organic light-emitting display as claimed in claim 5, wherein each PN photo diode includes an N-type doping region adjacent to a P-type doping region.

7. The organic light-emitting display as claimed in claim 2, further comprising a comparator that compares the electrical signals generated by the PIN photo diodes with the predetermined luminance value.

8. A portable electronic apparatus, comprising:

an organic light-emitting display device having a substrate including a pixel region and a non-pixel region, a thin film transistor in the pixel region of the substrate, an organic light-emitting diode in the pixel-region of the substrate and electrically connected to the thin film transistor, and a photo sensor having a plurality of PIN photo diodes connected to one another in parallel in the non-pixel region, wherein:

each PIN photo diode includes an intrinsic region between an N-type doping region and a P-type doping region, bottom surfaces of the intrinsic region and the N-type and P-type doping regions in each PIN photo diode being coplanar, at least one layer of the thin film transistor and the photo sensor are in a same plane, the plurality of PIN photo diodes are configured to absorb light emitted from the organic light-emitting diode and to convert the absorbed light into a corresponding electrical signal that represents an actual luminance value of the organic light-emitting diode to compare the actual luminance value to a predetermined luminance value, the plurality of PIN photo diodes in the photo sensor are capable of maintaining a constant luminance of light generated in the organic light-emitting diode by converting the absorbed light into the corresponding electrical signal such that the actual luminance value is generated by the plurality of PIN photo diodes for comparing with the predetermined luminance value, when the electrical signal outputted from the photo sensor is lower than the predetermined luminance value, a luminance of light emitted by the organic light-emitting diode is increased, and when the electrical signal outputted from the photo sensor is higher than the predetermined luminance value, the luminance of light emitted by the organic light-emitting diode is reduced.

9. The portable electronic apparatus as claimed in claim 8, further comprising a comparator that compares the electrical signals generated by the plurality of PIN photo diodes with the predetermined luminance value.

* * * * *